United States Patent [19]

Chiu

[11] Patent Number: 4,860,262

[45] Date of Patent: Aug. 22, 1989

[54] CACHE MEMORY RESET RESPONSIVE TO CHANGE IN MAIN MEMORY

[75] Inventor: Edison H. Chiu, Richardson, Tex.

[73] Assignee: Texas Instruments Incorporated, Dallas, Tex.

[21] Appl. No.: 81,925

[22] Filed: Aug. 5, 1987

[51] Int. Cl.[4] ............................................. G11C 7/00
[52] U.S. Cl. .................................... 365/218; 371/49; 365/189.01
[58] Field of Search ............... 365/218, 230, 201, 189; 371/49, 51

[56] References Cited

U.S. PATENT DOCUMENTS 4,099,069  7/1978  Cricchi et al. .................. 365/218 X
4,155,070  5/1979  Munter ................................ 371/49

Primary Examiner—Stuart N. Hecker
Assistant Examiner—Andrew L. Sniezek
Attorney, Agent, or Firm—Thomas R. FitzGerald; Leo N. Heiting; Melvin Sharp

[57] ABSTRACT

A circuit for resetting a multi-bit word in a digital memory at a selected address receives a word reset signal to cause entry into the selected address of a multi-bit word wherein all the bits are set to the same level and a parity bit is set to a value corresponding to parity in the multi-bit word. The circuit includes a parity generator which receives a multi-bit input data word and generates at least one parity bit therefrom. During a normal write operation, the multi-bit input data word and the parity bit are written into the digital memory at the selected address. During a word reset signal, output from the parity generator and the multi-bit input data word are blocked from entry into the memory.

10 Claims, 1 Drawing Sheet

CACHE MEMORY RESET RESPONSIVE TO CHANGE IN MAIN MEMORY

BACKGROUND OF THE INVENTION

1. Field of the Invention

This invention relates to word resetting in memories and more particularly to invalidating addresses in cache memories that correspond to the address of a newly written word in the main memory of a digital computer.

2. DESCRIPTION OF THE PRIOR ART

Currently, word invalidation may be achieved by using static random access memories (SRAM) to store and alter a bit indicating whether the word at a particular address is valid. A disadvantage to such a system is that additional SRAM must be added, taking up space and also requiring additional expense.

Another system writes a word of zeros into the pertinent addresses in the auxiliary memories. The disadvantage of this system is that the address register for performing this function is tied up and also the writing mode wastes time.

In today's technology of miniaturization, the extra circuitry and increase in bar size (semiconductor material) necessary to achieve a single word reset in large SRAM-based designs is formidable if normal reset circuitry is employed.

This invention achieves single word reset without significant increase in circuitry.

BRIEF SUMMARY OF THE INVENTION

A circuit for a digital memory word reset invalidates a word in a memory by setting all of the bits in that word to zero.

A single "valid" bit could obviously be set to zero, but the parity system would then be adversely affected. In this inventive circuit, the parity bit is also set to zero and entered with the reset multi-bit word.

The inventive circuit includes a parity generator which is connected to receive a multi-bit input data word and to generate at least one parity bit therefrom. Also included is an internal data bus for storing a multi-bit word to be written into the memory until a write command is issued from the computer system.

Reset circuitry includes input gates for receiving the multi-bit input data word. The input gates also are connected to be gated by a word reset signal. When a write command is issued and no word reset signal is generated, the multi-bit input data word is transmitted to the internal bus. At the same time, the parity generator generates a parity bit for the multi-bit word and transmits it to the internal bus. A write command is entered into the internal bus and causes the writing of the contents of the internal bus into the digital memory.

When a word reset signal is received by the input gates, then any generated parity bit and the multi-bit input data word are blocked from entry to the internal bus. Instead, the input gates, gated by the word reset signal, force the outputs of those gates to zeros, which are then entered in the internal bus. The write signal is delayed to permit this entry of the input gates into the internal bus, then causing the transfer out of the internal bus into the digital memory. In this preferred embodiment, the zeros transferred into the data bits represent a partial address.

The invention is particularly useful in digital computer systems that involve the use of cache memories. In such systems, the cache memories may each have a word of data at an address related to an address in the main memory which has exactly the same data. When the data is changed in the main memory by virtue of writing in a new word, the cache memory having the old data at the related address must have that address invalidated or the contents at that address updated. The invalidation is done by inserting zeros into a portion of the corresponding addresses.

In summary, when a word in main memory is changed by a write operation, then all identical words at associated addresses in all cache memories in this system are invalidated so that any subsequent reference made to the cache memories will not yield information that is different from the newly written information in the main memory.

A principal object of this invention is to provide a system for resetting a particular address in a memory by gating zeros into that address.

Another object of this invention is to provide a system for invalidating memory locations in cache memories whenever a data word at the same memory location in the main memory of a computer system is updated.

Another object of this invention is to provide a word invalidation system that provides for invalidation of a word at a given address by immediate entry of zeros and a parallel entry of a corresponding parity bit.

These and other objects will be made evident in the detailed description that follows.

BRIEF DESCRIPTION OF THE DRAWING

The FIGURE is a schematic diagram of the circuitry for resetting a multi-bit word in a digital memory.

DETAILED DESCRIPTION OF THE INVENTION

Figure 1:
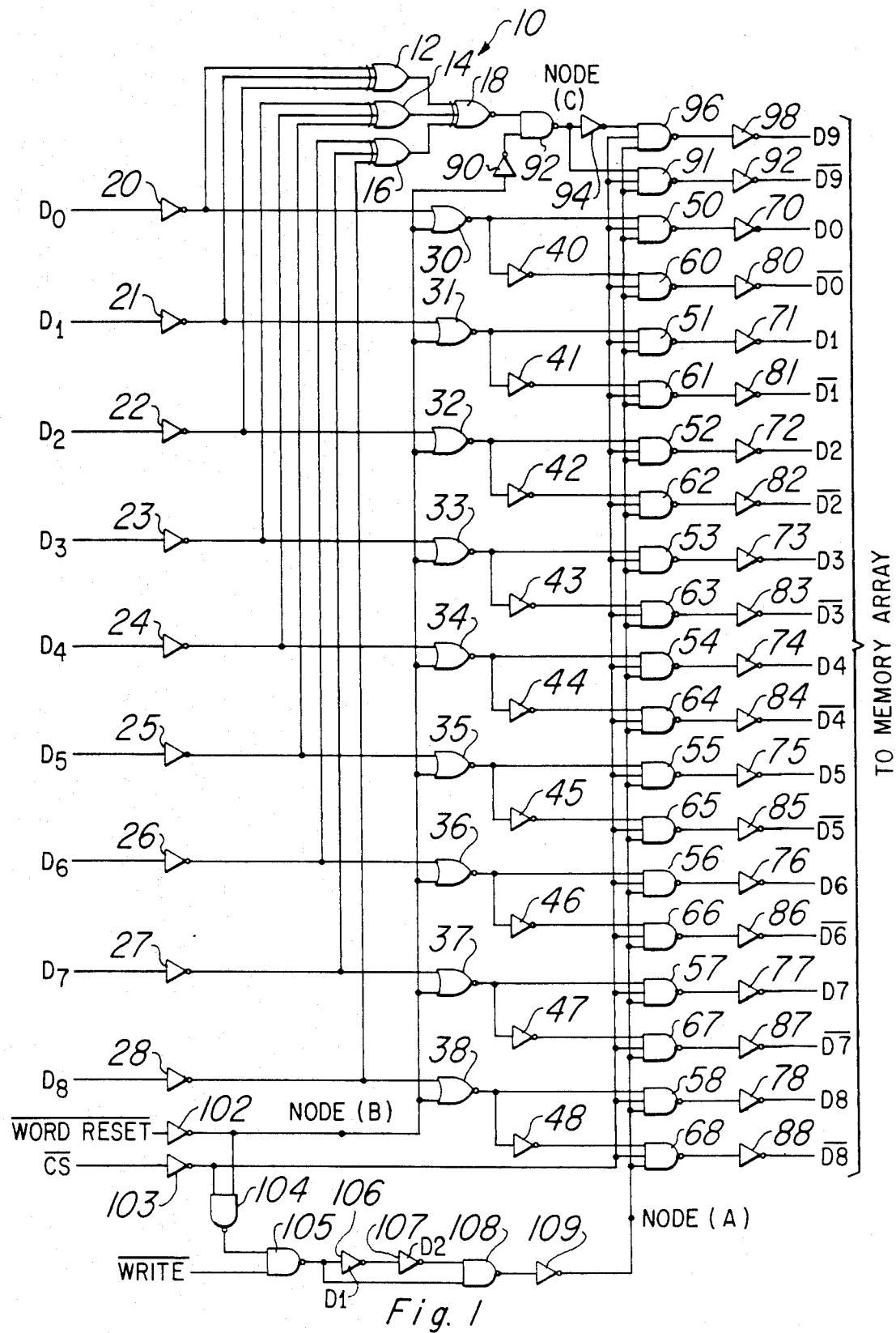

This invention is directed to circuitry for invalidating addresses in a memory. It is particularly suited for a digital computer system that uses at least one main memory and at least one associated cache memory. When a processor writes into an address in the main memory, if there is a corresponding address in the cache memory, that cache memory must be earmarked as invalid or the contents must be immediately changed to reflect the data written into the main memory. The practical solution is to invalidate the corresponding cache memory location. This invention makes that function economical in time and circuitry.

Also, in a single memory system, it may be desirable to write data into the memory, read the data, and check its correctness, and if incorrect, to invalidate that data. This invention, of course, permits such an application.

The FIGURE is a schematic diagram of the circuitry in this preferred embodiment that performs the function of invalidating (resetting) a memory location. As mentioned above, in the cache memory system, a portion of an address is actually reset, rather than data at a given address.

The input multi-bit data word is represented as signals D0–D8 which are applied to inverters 20–28. The outputs from inverters 20–22 are input to exclusive-OR circuit 12; the output from inverters 23–25 are input to exclusive-OR circuit 14; the outputs from inverters 26–28 are input to exclusive-OR circuit 16. The outputs from exclusive-OR circuits 12, 14 and 16 are input to exclusive-NOR circuit 18 to provide a parity signal. In this preferred embodiment, an odd parity system is used which is one wherein an odd number of "1's" in the input multi-bit data word will result in a "1" parity bit. This is of course an engineering design choice.

The outputs from inverters 20-28 respectively are input to NOR gates 30-38, respectively. A word RESET-signal from a computer system is applied to inverter 102 whose output is applied to the input of each of NOR gates 30-38, respectively.

The output from inverter 102 is also applied to inverter 90 whose output serves as an input to NAND gate 92. The other input to NAND gate 92 comes from exclusive-NOR gate 18. The word reset signal therefore controls gates 30-38 and 92.

The inputs to inverters 40-48 are connected to the outputs or NOR gates 30-38, respectively. The outputs from NOR-gates 30-38 are also connected as inputs to NAND gates 50-58, respectively. The outputs from inverters 40-48 are connected as inputs to NAND gates 60-68, respectively. The outputs from NAND gates 50-58 are input to inverters 70-78 to provide signals D'0 through D'8, respectively. The outputs from NAND gates 60-68 provide inputs to inverters 80-88, respectively, which in turn provide output signals D'0- through D'8-.

The output from inverter 102 which receives the signal WORD RESET- provides an input to NAND gate 104 whose other input is provided by inverter 103. The input to 103 is the chip select signal CS-, a signal selecting the chip. The output from NAND gate 104 provides one input to NAND gate 105 whose other input is provided by the write command signal WRITE-. The output from NAND gate 105 provides a direct input to NAND gate 108 and also provides an input to inverter D1 whose output is connected to the input of inverter 106 whose output provides an input to inverter 107 whose output provides another input to NAND gate 108. Inverters 106 and 107 provide a delay of the "0" output and NAND gate 108 when the output from NAND gate 105 is a "1". The output from NAND gate 108 is inverted through inverter 109 and is applied to the input of NAND gates 50-68, 91 and 96, respectively.

The output from inverter 103 which is the chip select signal is also applied to the inputs of NAND gate 50-68, 91 and 96, respectively.

The output from NAND gate 92 provides an input to NAND gate 96 via inverter 94 and also an input to NAND gate 91. The output from NAND gate 96 is inverted through inverter 98 and provides signal D'9 and the output from NAND gate 91 is inverted through inverter 92 and provides signal D'9-. Signals D'0 through D'9 and their inverse signals D'0- through D'9- are then written into the digital memory according to the input multi-bit data word D0-D8 or by the reset multi-bit word resulting from gates 30-38 and 92, respectively.

MODE OF OPERATION OF THE INVENTION

When WORD RESET- is high ("1") and signals CS- and WRITE- are both low ("0"), the circuit is in a WRITE mode. A multi-bit input data word, represented by signals D0-D8 are input, inverted and sent to the parity generator made up of exclusive-OR gates 12, 14 and 16, and exclusive-NOR gate 18 to yield a parity bit. At the same time, input signals D0-D8, inverted through inverters 20-28 are input to NOR gates 30-38. The outputs from NOR gates 30-38 are transmitted to NAND gates 50-58, and inverted and sent to the inputs of NAND gates 60-68.

With the WRITE- signal being a "0", the output from NAND gate 105 is a "1" which is immediately applied to the input of NAND gate 108. The output of NAND gate 108 at that time is a "1", resulting in a "0" out of inverter 109, disabling gates 50-68, 91 and 96.

A parity generated out of exclusive-NOR gate 18 is input to NAND gate 92 whose other input is supplied from inverter 90. Since WORD RESET- signal is "1", the output of inverter 102 is a "0" and the output of inverter 90 is a "1", enabling AND gate 92. If, for example, the parity generated is a "1", then a "0" will be output from NAND gate 92, inverted through inverter 94 and presented as a "1" to the input of NAND gate 96. Not inverted, it will appear as a "0" to the input of NAND gate 91.

While these signals were forming in NAND gates 50-68, 91 and 96, the enabling signal from inverter 109 was "0", therefore disabling those gates. The "1" output from NAND gate 105 is inverted through inverter 106 and again through 107 to provide a "1" input to the other input of NAND gate 108. The time taken for the two inversions is sufficient for the information to settle in the gates described above. At that time, a "0" is output from NAND gate 108, inverted through inverted 109 and applied as an enabling input to NAND gates 50-68, 91 and 96. The outputs from those gates are all inverted through inverters 70-88, 92 and 98 to provide outputs D'0 through D'9 and D'0- through D'9-. These signals are then written into the memory.

Now assume that signal WORD RESET- goes to a "0". Then the output from inverter 102 is a "1" that is applied to the inputs of each of gates 30-38, and is also inverted through inverter 90 and applied as an input to NAND gate 92. Under these conditions, NOR gates 30-38 are disabled and NAND gate 92 is disabled. All "0's" out of NOR gates 30-38 are transmitted to NAND gates 50-58 with their reciprocals residing in NAND gates 60-68. At the same time, a "0" on the input to NAND gate 92 from inverter 90 results in a "0" output which is inverted through inverter 94 and presented to the input of NAND gate 96 with a "1" being presented to the input of NAND gate 91.

As in the write operation described earlier, the delayed WRITE signal causes a "1" output from inverter 109, enabling the gates 50-68, 91 and 96 to transmit all "0's" to the memory at the addressed location.

This circuit enables writing a word into memory with its generated parity in a minimum of time. A minimum of time is also required in a practical sense for writing "0's" together with a "0" parity bit and this circuit accomplishes that function as well.

Those skilled in the art realize that this invention may be practices without exactly copying the circuitry as set out in this preferred embodiment. The invention is limited only by the appended claims.

I claim:

1. A circuit for writing a multi-bit word into a digital memory at a selected address upon receipt of a write command and responsive to a word reset signal for resetting a multi-bit word that includes at least one parity bit in the digital memory at a selected address, comprising:

(a) internal data memory circuit means for receiving a multi-bit word and responsive to reception of said write command to write the multi-bit word into the digital memory at a selected address;

(b) parity generator means connected to receive a multi-bit input data word and to generate at least one parity bit therefrom; and (c) resetting means responsive to receipt of said multi-bit word, said parity bit, and said word reset signal to write a reset multi-bit word to the internal data memory circuit means, all the bits of said word being set to a predetermined level and the parity bit being set to said predetermined level corresponding to parity for the reset multi-bit word for writing into the digital memory in the presence of the write command.

2. The circuit of claim 1 wherein the internal data memory circuit means comprises a plurality of bus gates.

3. The circuit of claim 2 wherein the plurality of bus gates further comprises a NAND gate for each position of the multi-bit word, including the parity bit, for generating each bit of the reset multi-bit word and the parity bit.

4. The circuit of claim 3 wherein the plurality of bus gates further comprise a second NAND gate for each position for generating the inverse of each bit and the party bit.

5. The circuit of claim 1 wherein the parity generator means comprises exclusive OR gate means for receiving the multi-bit data word, and exclusive NOR gate means for receiving the output of the exclusive OR gate means to provide a parity bit.

6. The circuit of claim 1 wherein the resetting means comprises a NOR gate for each position of the input multi-bit data word and a NAND gate for the parity bit, each of the NOR gates and the NAND gate connected to receive the word reset signal.

7. The circuit of claim 6 further comprising an inverter for inverting the word reset signal to provide an inverted word reset signal to the NAND gate.

8. The circuit of claim 1 wherein the resetting means comprises delay means for receiving and delaying the write signal until the reset multi-bit word and the corresponding parity bit have had time to enter the internal data memory circuit means.

9. The circuit of claim 8 wherein the delay means comprises a pair of inverters connected in series.

10. The circuit of claim 1 wherein each bit of the reset multi-bit word and the parity bit is set to zero.

* * * * *